(12) United States Patent
Tian et al.

(10) Patent No.: US 7,875,923 B2
(45) Date of Patent: Jan. 25, 2011

(54) BAND ENGINEERED HIGH-K TUNNEL OXIDES FOR NON-VOLATILE MEMORY

(75) Inventors: Wei Tian, Bloomington, MN (US); Insik Jin, Eagan, MN (US); Dimitar V. Dimitrov, Edina, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 338 days.

(21) Appl. No.: 12/120,715

(22) Filed: May 15, 2008

(65) Prior Publication Data

US 2009/0283816 A1    Nov. 19, 2009

(51) Int. Cl.
*H01L 29/788* (2006.01)
(52) U.S. Cl. .................. 257/321; 257/310; 257/324
(58) Field of Classification Search .............. 257/310, 257/321, 324, E29.3
See application file for complete search history.

(56) References Cited

U.S. PATENT DOCUMENTS

| | | | |
|---|---|---|---|
| 6,121,654 A * | 9/2000 | Likharev | 257/315 |
| 7,154,779 B2 | 12/2006 | Mokhlesi | |
| 7,274,067 B2 | 9/2007 | Forbes | |
| 7,282,773 B2 | 10/2007 | Li | |
| 7,465,983 B2 | 12/2008 | Eldridge | |
| 7,482,651 B2 * | 1/2009 | Bhattacharyya | 257/314 |
| 2006/0245245 A1 | 11/2006 | Mokhlesi | |
| 2007/0025145 A1 | 2/2007 | Mokhlesi | |
| 2008/0009117 A1 * | 1/2008 | Bhattacharyya et al. | 438/264 |

OTHER PUBLICATIONS

Likharev, Layered Tunnel Barriers for NonVolatile Memory Devices, 1998 American Inst. of Physics, Oct. 12, 98, vol. 73, No. 15, pp. 2137-2139.
Robertson, Band Offsets of Wide-Band-Gap Oxides and Implications for Future Electronic Devices, J. Vac. Sci. Technol. B 18(3), May/Jun. 2000.
Afanas'ev et al., Band Alignment Between (1000) Si and Amorphous . . . , Appl. Phys. Lett. 88, No. 012304 (2006).
Schlom et al., Measurement of the Band Offsets Between Amorphous . . . , Appl. Phys. Lett. 84, No. 5 (2004).

* cited by examiner

*Primary Examiner*—Phuc T Dang
(74) *Attorney, Agent, or Firm*—Campbell Nelson Whipps LLC

(57) ABSTRACT

A non-volatile memory cell that has a charge source region, a charge storage region, and a crested tunnel barrier layer that has a potential energy profile which peaks between the charge source region and the charge storage region. The tunnel barrier layer has multiple high-K dielectric materials, either as individual layers or as compositionally graded materials.

11 Claims, 3 Drawing Sheets

BAND ENGINEERED HIGH-K TUNNEL OXIDES FOR NON-VOLATILE MEMORY

BACKGROUND

Semiconductor memory devices are used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories. Non-volatile memories can store data without power supply for long periods of time, such as a year or more, but the act of writing data into such memories is slow, requiring microseconds.

Attempts have been made to enhance memory performance, by using "crested" barriers, with the potential barrier height peaking in the middle and decreasing toward the interfaces with the electrodes. Parabolic barriers and stepped barriers have been proposed, but suitable and practical configurations and methods of making the barriers have been lacking.

BRIEF SUMMARY

The present disclosure relates to crested barriers composed of band engineered high-K dielectric materials that improve the programming speed and data retention (e.g., reduce charge leakage) for non-volatile memory, e.g., flash memory. Multiple layers of high-K dielectric materials are selected to form a digitally crested tunnel barrier. Alternately, compositionally graded materials are used to form the digitally crested tunnel barrier. The crested tunnel barriers have a potential energy profile that peaks between the charge supply region and the charge storage region and that decreases from the peak to the charge supply region and to the charge storage region. Such a barrier allows faster programming speed and longer retention time, as compared to a flat-band tunnel barrier conventionally implemented in non-volatile memory, e.g., flash memory. Also disclosed are storage devices utilizing the crested tunnel barriers.

In one particular embodiment, this disclosure is directed to a non-volatile memory cell or unit that has a charge source region, a charge storage region, and a crested tunnel barrier layer therebetween. The tunnel barrier layer has an inner region comprising $SiO_2$, and first and second outer regions positioned on each side of the inner region. Each of the inner region and the outer regions has a conduction band offset, with the inner region having a higher potential energy profile than each of the outer regions. The first outer region is positioned proximate the charge source region and the second outer region is positioned proximate the charge storage region. In some embodiments, each of the outer regions comprises at least one of $Al_2O_3$, $HfO_2$, $LaScO_3$, $LaAlO_3$, $Y_2O_3$, $ZrO_2$, $La_2O_3$, $SrTiO_3$, $Ta_2O_5$, and $Si_3N_4$ high-K dielectric materials. The inner region and the outer regions may be individual layers of different materials, or may include compositionally graded material.

BRIEF DESCRIPTION OF THE DRAWING

The invention may be more completely understood in consideration of the following detailed description of various embodiments of the invention in connection with the accompanying drawing, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

Two general types of crested tunnel barriers that improve the programming speed and data retention of non-volatile memory, e.g., flash memory, are discussed herein. The crested tunnel barriers have a potential energy profile that peaks between the charge supply region and the charge storage region and that decreases from the peak to the charge supply region and to the charge storage region. Such barriers allow faster programming speed and longer retention time (e.g., reduces charge leakage), as compared to a flat-band tunnel barrier conventionally implemented in non-volatile memory, e.g., flash memory. One type of crested tunnel barrier according to this invention utilizes multiple layers of high-K dielectric materials selected to form a digitally crested tunnel barrier. The second type of crested tunnel barrier according to this invention utilizes a compositionally graded high-K dielectric material comprising at least two materials to form the digitally crested tunnel barrier. Also disclosed are storage devices utilizing the crested tunnel barriers.

Figure 1:
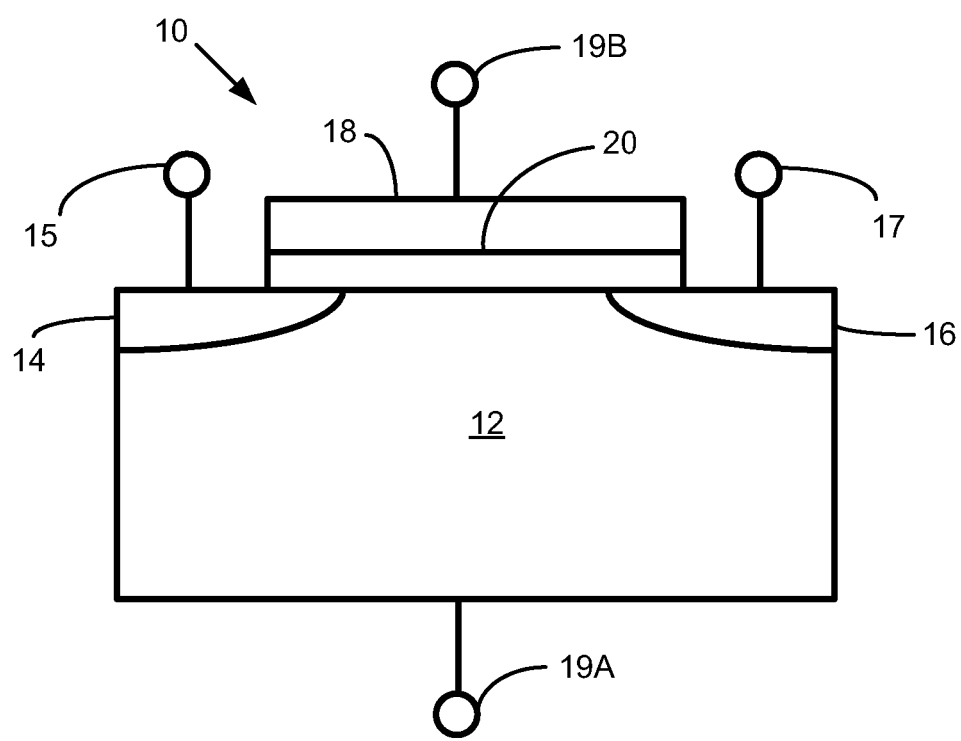
FIG. 1 is a schematic side view of a non-volatile memory cell or transistor.

FIG. 1 illustrates a non-volatile memory cell or transistor 10. Transistor 10 has a substrate 12 (e.g., Si substrate, such as a p-type or n-type Si) with a source or supply region 14 electrically connected to a source line 15 (e.g., a bit line or a word line) and a drain region 16 electrically connected to a drain line 17 (e.g., a bit line or a word line). Proximate substrate 12 and connecting source region 14 and drain region 16 is a gate 18. Gate 18 is configured to store a voltage or current passed thereto by lines 19A, 19B across substrate 12.

Positioned between gate 18 and substrate 12 is a gate dielectric layer 20, which is also referred to as a tunnel barrier, tunnel oxide barrier layer, and the like. Transistor 10 has a configuration well know in semiconductor applications. Gate dielectric 20, however, is a crested tunnel barrier or barrier layer in accordance with the invention of this disclosure. Other variations of transistor 10 are suitable for use with the crested tunnel barrier or barrier layer in accordance with the invention of this disclosure.

Figure 2:
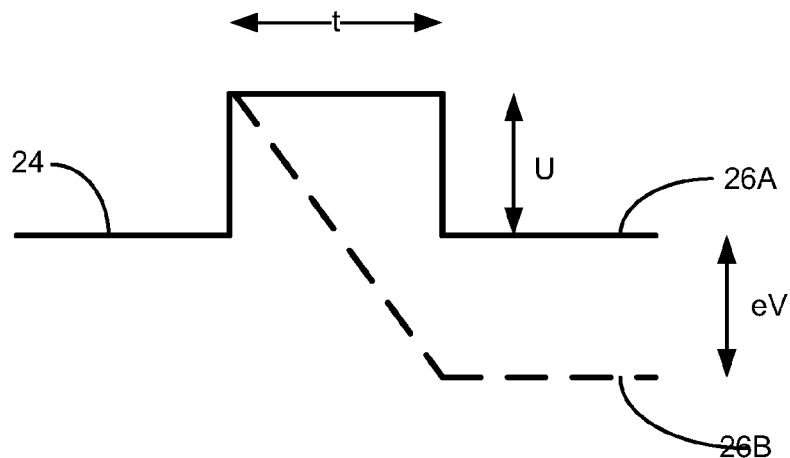
FIG. 2 is an energy band edge diagram for a flat-band tunnel barrier, shown with and without a voltage applied.
Figure 3:
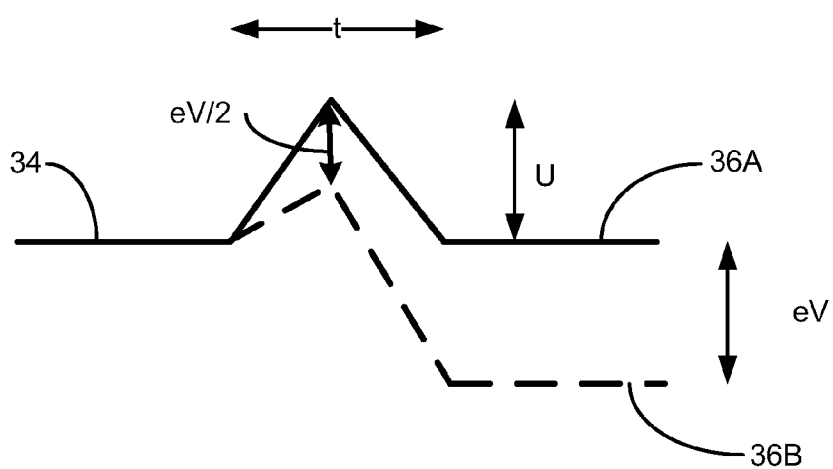
FIG. 3 is an energy band edge diagram for a crested-band tunnel barrier, shown with and without a voltage applied.

FIGS. 2 and 3 illustrate how crested tunnel barriers allow faster programming speeds and require less energy than flat-band tunnel barriers. FIG. 2 is an energy band edge diagram for a flat-band tunnel barrier, shown with and without a voltage applied. FIG. 3 is an energy band edge diagram for a crested tunnel barrier, shown with and without a voltage applied. When voltage is applied to a tunnel barrier (illustrated by the dotted lines), the potential provide is reduced or pulled down, reducing the barrier transparence and the current needed for electrons to tunnel through the barrier.

FIG. 2 shows a uniform barrier layer, having a constant energy profile or barrier height across the thickness of the tunnel oxide layer. An example of such a layer is a dielectric material, $SiO_2$, which has a rectangular barrier profile. In FIG. 2, reference numeral 24 indicates a charge supply region (such as source region 14 of transistor 10) and reference numerals 26A, 26B indicate the charge storage region (such as gate 18 of transistor 10), "t" indicates the thickness of the layer (e.g., about 100 Angstroms), "U" represents the energy (in eV) needed by electrons to cross the tunnel barrier layer.

For the uniform barrier layer, the potential profile (i.e., the energy needed for electrons to cross the tunnel barrier layer) is reduced linearly when voltage is applied, as illustrated by the dotted line. For a rectangular barrier, the highest part of the barrier, proximate the charge supply region, remains unaltered by the application of voltage. Because it is the highest part of the barrier that most affects the barrier transparence and thus the current needed to tunnel through the layer, a rectangular barrier is not generally affected by the application of voltage.

Conversely, for a crested tunnel barrier, as illustrated in FIG. 3, the potential barrier height peaks in the middle between the charge supply region and the charge storage region and gradually decreases toward the charge storage region. The peak of the barrier, proximate the center, is pulled down strongly by the application of voltage, as illustrated by the dotted line in FIG. 3, providing increased barrier transparence and reducing the tunneling current needed. In FIG. 3, reference numeral 34 indicates the charge supply region and reference numerals 36A, 36B indicate the charge storage region, "t" indicates the thickness of the layer, "U" represents the energy (in eV) needed by electrons to cross the crested tunnel barrier layer.

Figure 4:
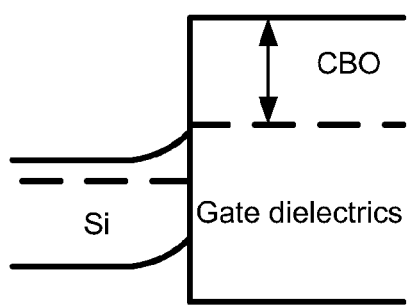
FIG. 4 is a schematic side view of the band alignment of high-K gate dielectrics with response to Si.

Attempts have been made to replace $SiO_2$ tunnel barriers with high-K dielectric materials. "High-K" materials have a high dielectric constant (K) as compared to silicon dioxide ($SiO_2$). Table 1 lists several high-K materials and their conduction band offset levels (CBO) in relation to silicon (Si). The conduction band offset of the high-K dielectrics have a wide range of values. FIG. 4 is a schematic of the band alignment of high-K dielectrics from Table 1 in relation to Si, in particular, n-type Si. The conduction band offset (CBO) measures the energy level difference between the conduction bands of Si and the high-K dielectrics. This energy level difference provides an energy barrier for electrons to move from Si to high-K dielectrics.

In accordance with this invention, a deliberately engineered layer of high-K dielectric materials can provide a crested tunnel barrier with improved properties over previous crested tunnel barriers. The layer has a middle region and first and second outer regions on either side of the middle region. The middle region has a higher potential energy profile or conduction band offset than the outer regions. The tunnel barrier layer is positioned so that the outer regions of the layer are proximate the charge source region (e.g., source region 14 of transistor 10 of FIG. 1) and the charge storage region (e.g., gate 18 of transistor 10).

TABLE 1

| High-K oxide | CBO in relation to Si |
|---|---|
| $Al_2O_3$ | 2.8 |
| $HfO_2$ | 1.5 |
| $LaScO_3$ | 1.8 |
| $LaAlO_3$ | 2.0 |
| $Y_2O_3$ | 1.3 |
| $ZrO_2$ | 1.4 |
| $La_2O_3$ | 1.3 |
| $SrTiO_3$ | <0.1 |
| $Ta_2O_5$ | 0.3 |
| $Si_3N_4$ | 2.4 |
| $SiO_2$ | 3.5 |

Figure 5:
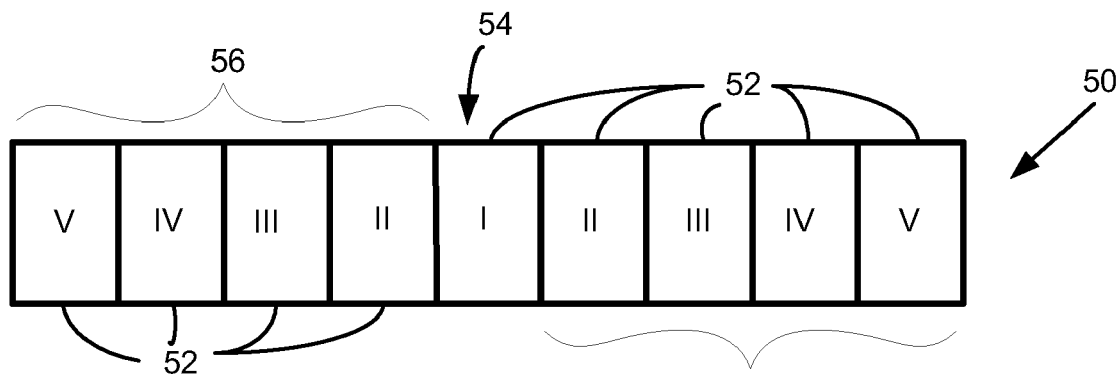
FIG. 5 is a schematic plan view of a multiple layered oxide tunnel barrier according to this disclosure.
Figure 6:
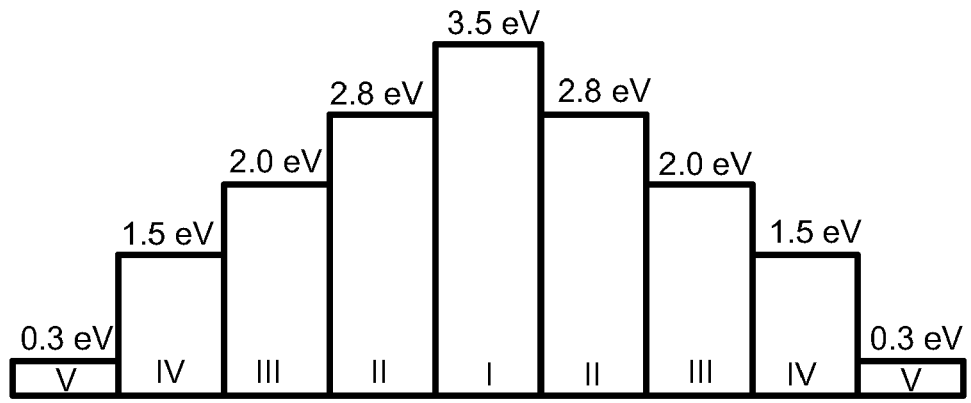
FIG. 6 is a graphical representation of the conduction band offset (in eV) for the oxide tunnel barrier of FIG. 5.

A first embodiment for a band engineered crested tunnel barrier is illustrated in FIGS. 5 and 6. FIG. 5 shows a tunnel barrier 50 having a plurality of individual layers 52, arranged as an inner region 54 and outer regions 56, 58. In the illustrated embodiment, tunnel barrier 50 has nine layers 52. Inner region 54 includes at least one of those layers 52 and each of outer regions 56, 58 include at least one of those layers 52. Band engineered crested tunnel barriers in accordance with this disclosure have at least three individual layers, usually at least five individual layers. In most embodiments, the number of layers is an odd number, so that a central layer has an equal number of layers on each side thereof. Other examples of band engineered crested tunnel barriers may have seven, eleven, thirteen, fifteen, etc. individual layers. The thickness of barrier layer 50 is often less than about 200 Angstroms, in some embodiments less than about 100 Angstroms. The thickness of each layer 52 is usually about 5-50 Angstroms, and in some embodiments is about 10-20 Angstroms or less. When nine layers 52 are present, an exemplary thickness for each layer 52 is about 10 Angstroms or less.

Tunnel barrier 50 is composed of five different high-K dielectric materials. Each material of each individual layer 52 is identified with a Roman numeral (i.e., I, II, III, IV, V) in FIGS. 5 and 6 indicating the material used for each layer. The high-K materials are selected and arranged in barrier 50 based on their conduction band offset values; FIG. 6 illustrates five high-K materials, arranged in nine layers based on their CBO values. As can be seen, the five high-K materials are arranged to provide a potential energy profile which peaks or is highest between the charge source region (e.g., source region 14 of transistor 10 of FIG. 1) and the charge storage region (e.g., gate 18 of transistor 10). Inner region 54 (FIG. 5) includes at least Layer I and outer regions 56, 58 include at least Layer V.

Table 2 lists the high-K materials and their conduction band offset values for the schematic FIG. 6. Other embodiments of crested tunnel barriers having individual layers can use any high-K dielectric materials, not limited to those listed in Table 1.

TABLE 2

| Layer | Material | CBO |
|---|---|---|
| I | $SiO_2$ | 3.5 eV |
| II | $Al_2O_3$ | 2.8 eV |
| III | $LaScO_3$ | 2.0 ev |
| IV | $HfO_2$ | 1.5 eV |
| V | $T_2O_5$ | 0.3 eV |

The material with the highest CBO is positioned in inner region 54, at the center of layer 50, with subsequent adjacent layers decreasing in CBO. Although not required to be present in the inner region, $SiO_2$ is a preferred central material as it provides the largest CBO with respect to Si; other high-K dielectrics with lower CBO could alternately be used in the center. A benefit of including $SiO_2$ is that it has the largest CBO so it can allow the steepest slope for the crested barrier.

The example of FIG. 6 and Table 2 is symmetrical around the center layer and each layer 52 has the same thickness (e.g., about 10 Å or about 15 Å). In alternate embodiments, the materials selected for layers 52 and/or their conduction band offset may not be symmetrical when arranged as layer 50. For example, the two layers immediately adjacent the center layer may not be the same high-K material. In another example, the individual layers may not have the same thickness.

In yet alternate embodiments, the high-K dielectric material with the highest CBO may be positioned offset from the center of layer 50 but still within inner region 54, forming an asymmetrical energy barrier profile. This may happen, for example, if there is an even number of layers 52. Alternately, the material with the highest CBO may be positioned closer to the charge supply or source region than to the storage region. The conduction band offset values should decrease sequentially from the highest CBO to the outer layers proximate the charge supply or source region and the storage region.

Crested tunnel layer 50 having multiple individual layers 52 of material can be made by well-known thin film techniques such as chemical vapor deposition (CVD), physical vapor deposition (PVD), and atomic layer deposition (ALD). The high-K dielectric material being used, the thickness of the resulting layer 52, etc. will affect the preferred technique.

Figure 7:
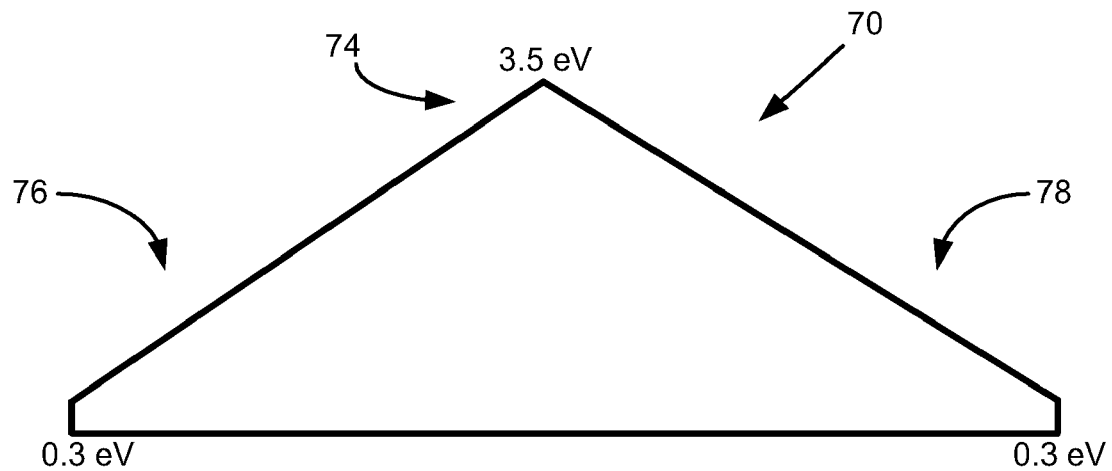
FIG. 7 is a graphical representation of the conduction band offset (in eV) for a second exemplary embodiment of an oxide tunnel barrier according to this disclosure.

An energy barrier profile for a second embodiment for a band engineered crested tunnel barrier is illustrated in FIG. 7. This second embodiment crested tunnel barrier is similar to tunnel barrier 50, described above, in that they both combine a plurality of high-K dielectric materials to achieve a crested tunnel barrier. This second embodiment crested tunnel barrier, however, chemically combines a plurality of high-K dielectric materials whereas for tunnel barrier 50 the high-K materials are separate layers of the materials stacked together.

This second embodiment crested tunnel barrier is formed from a single layer of material that is compositionally graded across its thickness. Two or more high-K dielectric materials are combined to create the crested energy profile having an inner region and two outer regions. In this embodiment, the mole fraction of the high-K materials varies from the inner region to the outer regions and across the thickness of the layer. FIG. 7 illustrates a crested energy profile 70 having an inner region 74 having a higher potential energy profile than outer regions 76, 78. For outer regions 76, 78 of the tunnel barrier layer, those proximate the charge supply or source region and the storage region, the material is predominately the high-K material having the lower CBO. Inner region 74 at the center of the tunnel barrier layer, the material is predominantly the high-K material having the highest CBO.

To obtain the energy barrier illustrated in FIG. 7, two high-K dielectric materials are used, $Ta_2O_5$ and $SiO_2$, present in the composition $(Ta_2O_5)_x(SiO_2)_{1-x}$, where x varies through the thickness of the layer. At the edges of the tunnel barrier layer, x=1 so that the composition is entirely $Ta_2O_5$; at the center of the tunnel barrier layer, x=0 so that the composition is entirely $SiO_2$.

Other embodiments of crested tunnel barriers having a compositionally graded material can use any high-K dielectric materials, not limited to only $Ta_2O_5$ and $SiO_2$ or those listed in Table 1. Again, although $SiO_2$ is not required to be present in the inner region, $SiO_2$ is a preferred central material as it provides the largest CBO with respect to Si and allows the steepest slope for the crested barrier.

A compositionally graded crested tunnel layer can be made by well-known thin film techniques such as chemical vapor deposition (CVD), physical vapor deposition (PVD), and atomic layer deposition (ALD).

In some embodiments, it may be desired to have a crested tunnel barrier layer that is composed of both individual layers and compositionally graded high-K dielectric materials. For example, at least one of the layers of a multiple layer tunnel barrier could be a compositionally graded material.

Thus, embodiments of the BAND ENGINEERED HIGH-K TUNNEL OXIDES FOR NON-VOLATILE MEMORY are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A non-volatile memory unit comprising:
   a charge source region;
   a charge storage region; and
   a crested tunnel barrier layer therebetween, the crested tunnel barrier layer having an inner region comprising $SiO_2$ and having a first conduction band offset, a first outer region comprising a high-K dielectric material having a second conduction band offset and a second outer region comprising a high-K dielectric material having a third conduction band offset, the first conduction band offset greater than each of the second and third conduction band offsets, the crested tunnel barrier layer positioned with the first outer region proximate the charge source region and the second outer region proximate the charge storage region.

2. The memory unit of claim 1 wherein the first and second outer regions each comprise at least one of $Al_2O_3$, $HfO_2$, $LaScO_3$, $LaAlO_3$, $Y_2O_3$, $ZrO_2$, $La_2O_3$, $SrTiO_3$, $Ta_2O_5$, and $Si_3N_4$ high-K dielectric materials.

3. The memory unit of claim 2 wherein the inner region is an inner layer and each of the outer regions comprises an outer layer.

4. The memory unit of claim 3 wherein the first and second outer regions each comprise at least two of $Al_2O_3$, $HfO_2$, $LaScO_3$, $LaAlO_3$, $Y_2O_3$, $ZrO_2$, $La_2O_3$, $SrTiO_3$, $Ta_2O_5$, and $Si_3N_4$ high-K dielectric materials.

5. The memory unit of claim 4 wherein the at least two high-K dielectric materials of each outer region are present as individual layers.

6. The memory unit of claim 3 wherein the first and second outer regions each comprise at least three of $Al_2O_3$, $HfO_2$, $LaScO_3$, $LaAlO_3$, $Y_2O_3$, $ZrO_2$, $La_2O_3$, $SrTiO_3$, $Ta_2O_5$, and $Si_3N_4$ high-K dielectric materials.

7. The memory unit of claim 5 wherein the at least three high-K dielectric materials of each outer region are present as individual layers.

8. The memory unit of claim 7 where each high-K dielectric material is a layer having a thickness of about 20 Angstroms or less.

9. The memory unit of claim 8 where each high-K dielectric material is a layer having a thickness of about 10 Angstroms or less.

10. The memory unit of claim 1 wherein the second conduction band offset is the same as the third conduction band offset.

11. The memory unit of claim 1 wherein the second conduction band offset is different than the third conduction band offset.

* * * * *